United States Patent
Khurana et al.

(10) Patent No.: US 11,416,578 B2
(45) Date of Patent: Aug. 16, 2022

(54) AUTOMATED PLANNING BASED ON CONVERTING DISCRETE FRAMEWORKS TO CONTINUOUS FRAMEWORKS

(71) Applicant: Accenture Global Solutions Limited, Dublin (IE)

(72) Inventors: Namita Khurana, Delhi (IN); Sangitika Rana, Gurgaon (IN); Amitava Dey, New Delhi (IN); Mayank Ahuja, Delhi (IN); Sanjay Sharma, New Delhi (IN)

(73) Assignee: Accenture Global Solutions Limited, Dublin (IE)

( * ) Notice: Subject to any disclaimer, the term of this patent is extended or adjusted under 35 U.S.C. 154(b) by 934 days.

(21) Appl. No.: 16/193,164

(22) Filed: Nov. 16, 2018

(65) Prior Publication Data
US 2020/0159806 A1 May 21, 2020

(51) Int. Cl.
*G06F 17/11* (2006.01)
*G06Q 10/08* (2012.01)
*G06Q 30/02* (2012.01)

(52) U.S. Cl.
CPC .......... *G06F 17/11* (2013.01); *G06Q 10/087* (2013.01); *G06Q 30/0201* (2013.01)

(58) Field of Classification Search
CPC ....... G06F 17/11; G06F 30/20; G06Q 10/087; G06Q 30/0201
USPC .......................................................... 703/2
See application file for complete search history.

(56) References Cited

FOREIGN PATENT DOCUMENTS

EP        3654226        5/2020
KR    20080105439 A   * 12/2008

OTHER PUBLICATIONS

Lenz Belzner, OnPlan: A Framework forSimulation-Based Online Planning, 2016 (Year: 2016).*
Extended European Search Report dated Mar. 25, 2020 for European Patent Application No. 19205856.8.
Anonymous: "Travelling salesman problem—Wikipedia", Aug. 28, 2018, XP055545287; https://en.wikipeida.org/w/index.php?title=Travelling_salesman_probme&oldid=856886923; [Retrieved Jan. 21, 2019].

(Continued)

*Primary Examiner* — Tarek Elchanti
(74) *Attorney, Agent, or Firm* — Plumsea Law Group, LLC

(57) ABSTRACT

A system and method for determining a result that includes a solution for a discrete non-linear optimization model for an optimization problem is disclosed. A non-linear relationship between a key performance indicator (KPI) to be optimized and at least one decision variable is determined using econometric modeling. A discrete optimization framework for the optimization problem is determined using a plurality of discrete values of decision variables of the optimization problem. A binary optimization framework is determined from the determined discrete optimization framework based on automatically revising an optimization equation of the discrete optimization framework. A continuous framework is determined from the determined binary optimization framework based on imposing additional constraints and based on modifying the optimization problem. The result is generated, and an action is controlled based on the result.

20 Claims, 15 Drawing Sheets

(56) References Cited

OTHER PUBLICATIONS

Janos D. Pinter : "Nonlinear Optimization in Modeling Environments" In: "Continuous Optimization. Applied Optimization", Apr. 30, 2005, Springer, Boston, XP055669755, pp. 147-173, DOI: 10.1007/0-387-26771-9_5.
Response to Communication under Rule 70(2) and 70a(2) EPC and reference to Rule 39(1) EPC as filed on Jul. 30, 2020 for European Patent Application No. 19205856.8.

* cited by examiner

Determining the discrete optimization framework — 302

$$Demand = B * e^{\beta d} * \Pi\, e^{\gamma d'}$$ — 304

$$Revenue = Demand * Price$$ — 306 where,
- $B$ = base sales
- $\beta$ = price elasticity
- $\gamma$ = cross price elasticity
- $d$ = price discount
- $d'$ = discount offered by cannibalizing products — 308

*FIG. 3A*

Determining the optimization problem — 310

$$Max \sum_i [D_i \times (P_i)] = Max \sum_i \left[B_i * e^{\beta_i d_i} * \prod_j e^{\gamma_{ij} d_j} \right] \times (P_i)$$

subject to,

Min/Max number of promotions per object
Min/Max number of objects on promotion in a week/period $$P_i \in \{P_1, P_2, P_3, P_4, P_5\}$$
$$i \in \{1,2\}$$ — 312

$j \rightarrow$ Cannibalizing objects $$Max \sum_i \left[B_i * \sum_k e^{\beta_i d_{ik}} D_{ik} * \prod_j \left\{\sum_k e^{\gamma_{ij} d_{jk}} D_{jk}\right\} \times \sum_k (D_{ik} * P_{ik})\right]$$

where, $$i,j \in \{1,2\}$$
$$k \in \{1,2,3,4,5\}$$

— 314

$D_{ik}$ and $D_{jk}$ = decision variables corresponding to each discrete price point $$D_{jk} \in \{0,1\} \quad D_{ik} \in \{0,1\}$$

*FIG. 3B*

Converting the binary optimization problem to a continuous problem — 402

Formulating the constraint into a continuous variable form — 404

$$Max \sum_i \left[ B_i * \sum_k e^{\beta_i d_{ik}} D_{ik} * \prod_j \left\{ \sum_k e^{\gamma_{ij} d_{ijk}} D_{jk} \right\} \times \sum_k (D_{ik} * P_{ik}) \right]$$

subject to,
*Min/Max number of promotions per object*
*Min/Max number of objects on promotion in a week/ period*

$$P_i \in \{P_1, P_2, P_3, P_4, P_5\}$$

$$i \in \{1,2\} \quad D_{ik} \in \{0,1\} \quad D_{jk} \in \{0,1\}$$

$$\sum x(1-x) = 0$$

In-case, equality constraints not allowed in the optimization algorithm -

$$\sum x(1-x) >= 0 \quad \text{and} \quad \sum x(1-x) <= 0$$

Adding the constraint as a penalty function — 406

Instead of adding the non-linear constraint in the optimization, adding it as a penalty function Let $f(x)$ $$= Max \sum_i \left[ B_i * \sum_k e^{\beta_i d_{ik}} D_{ik} * \prod_j \left\{ \sum_k e^{\gamma_{ij} d_{ijk}} D_{jk} \right\} \times \sum_k (D_{ik} * P_{ik}) \right]$$

The objective function is : $Max\ f(x)$
This function is translated to -

$$Min\ F(x) = -f(x) + \gamma \sum_j [x(1-x)] \qquad x_j = D_{ik}, D_{jk}$$

With this, the decision variables would be forced to 0 or 1
Hence, it would now be: $Min\ F(x)$ subject to,
*Min/Max number of promotions per object*
*Min/Max number of objects on promotion in a week/ period*

$$P_i \in \{P_1, P_2, P_3, P_4, P_5\} \qquad D_{ik} \in \{0,1\} \qquad D_{jk} \in \{0,1\}$$

| Product | Week | Allowed Price Points | | | | | Econometric Model Output | | | |
|---|---|---|---|---|---|---|---|---|---|---|
| | | Base Price | Promo Price 1 | Promo Price 2 | Promo Price 3 | Promo Price 4 | Base Sales | Discount Elas. | Prod 1 - Cann | Prod 2 - Cann |
| Product 1 | Week 1 | 20.0 | 19.0 | 18.2 | 17.0 | 16.6 | 100 | + 0.030 | - | - 0.009 |
| Product 1 | Week 2 | 20.0 | 19.5 | 18.0 | 17.6 | 16.0 | 130 | + 0.030 | - | - 0.009 |
| Product 2 | Week 1 | 15.0 | 14.0 | 13.0 | 12.7 | 11.0 | 145 | + 0.024 | - 0.001 | - |
| Product 2 | Week 2 | 15.0 | 14.5 | 13.4 | 12.0 | 11.4 | 160 | + 0.024 | - 0.001 | - |

502 / 504 / 506 / 508

Product 1 – Week 1
Product 1 – Week 2
Product 2 – Week 1
Product 2 – Week 2

Optimization Problem Formulation   $Max\ Revenue = Q_1 * P_1 + Q_2 * P_2$

510 / 512

= 100 * e {[(0.030*(20.0−20.0)/20.0*100*D1}+{(0.030*(20.0−19.0)/20.0*100*D2}+{(0.030*(20.0−18.2)/20.0*100*D3}+{(0.030*(20.0−17.0)/20.0*100*D4}+{(0.030*(20.0−16.6)/20.0*100*D5}} * e {[(-0.009*(15.0−15.0)/15.0*100*D11}+{(-0.009*(15.0−14.0)/15.0*100*D12}+{(-0.009*(15.0−13.0)/15.0*100*D13}+{(-0.009*(15.0−12.7)/15.0*100*D14}+{(-0.009*(15.0−11.0)/15.0*100*D15}} * [20.0 * D1 + 19.0 * D2 + 18.2 * D3 + 17.0 * D4 + 16.6 * D5]
+ 130 * e {[(0.030*(20.0−20.0)/20.0*100*D6}+{(0.030*(20.0−19.5)/20.0*100*D7}+{(0.030*(20.0−18.0)/20.0*100*D8}+{(0.030*(20.0−17.6)/20.0*100*D9}+{(0.030*(20.0−16.0)/20.0*100*D10}} * e {[(-0.009*(15.0−15.0)/15.0*100*D16}+{(-0.009*(15.0−14.5)/15.0*100*D17}+{(-0.009*(15.0−13.4)/15.0*100*D18}+{(-0.009*(15.0−12.0)/15.0*100*D19}+{(-0.009*(15.0−11.4)/15.0*100*D20}} * [20.0 * D6 + 19.5 * D7 + 18.0 * D8 + 17.6 * D9 + 16.0 * D10]
+ 145 * e {[(0.024*(15.0−15.0)/15.0*100*D11}+{(0.024*(15.0−14.0)/15.0*100*D12}+{(0.024*(15.0−13.0)/15.0*100*D13}+{(0.024*(15.0−12.7)/15.0*100*D14}+{(0.024*(15.0−11.0)/15.0*100*D15}} * e {[(-0.001*(20.0−20.0)/20.0*100*D1}+{(-0.001*(20.0−19.0)/20.0*100*D2}+{(-0.001*(20.0−18.2)/20.0*100*D3}+{(-0.001*(20.0−17.0)/20.0*100*D4}+{(-0.001*(20.0−16.6)/20.0*100*D5}} * [15.0 * D11 + 14.0 * D12 + 13.0 * D13 + 12.7 * D14 + 11.0 * D15]
+ 160 * e {[(0.024*(15.0−15.0)/15.0*100*D16}+{(0.024*(15.0−14.5)/15.0*100*D17}+{(0.024*(15.0−13.4)/15.0*100*D18}+{(0.024*(15.0−12.0)/15.0*100*D19}+{(0.024*(15.0−11.4)/15.0*100*D20}} * e {[(-0.001*(20.0−20.0)/20.0*100*D6}+{(-0.001*(20.0−19.5)/20.0*100*D7}+{(-0.001*(20.0−18.0)/20.0*100*D8}+{(-0.001*(20.0−17.6)/20.0*100*D9}+{(-0.001*(20.0−16.0)/20.0*100*D10}} * [15.0 * D16 + 14.5 * D17 + 13.4 * D18 + 12.0 * D19 + 11.4 * D20]

Subject to constraints –

D1, D2,...,D20 ∈ 0 or 1       D1 + D2 + D3 + D4 + D5 = 1       D11 + D12 + D13 + D14 + D15 = 1       Any other constraint on promotions can be specified in similar manner
                              D6 + D7 + D8 + D9 + D10 = 1      D16 + D17 + D18 + D19 + D20 = 1

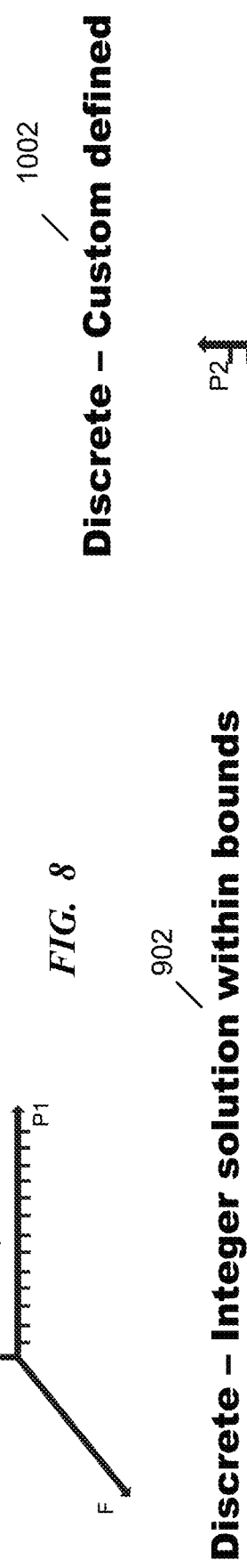
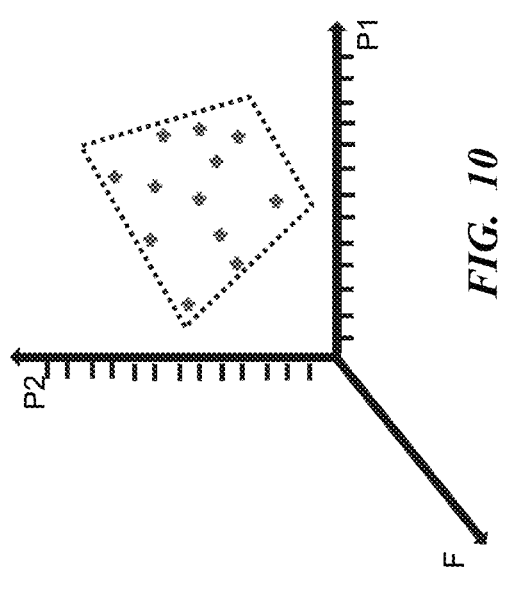
FIG. 10
FIG. 8
FIG. 9

| Category | SKU | Weeks | | | | |
|---|---|---|---|---|---|---|
| | | Week 1 | Week 2 | Week 3 | Week 4 | Week 5 |
| CG 1 | SKU 1 | p11 | p12 | p13 | p14 | p15 |
| CG 1 | SKU 2 | p21 | p22 | p23 | p24 | p25 |
| CG 1 | SKU 3 | p31 | p32 | p33 | p34 | p35 |
| CG 1 | SKU 4 | p41 | p42 | p43 | p44 | p45 |
| CG 1 | SKU 5 | p51 | p52 | p53 | p54 | p55 | where,
$p_{ij}$ is the price of object i in week j  for i = 1,2,3,4,5 and j = 1,2,3,4,5
P1 refers to the base price for these objects subject to,
number of SKUs on promotion in week 3 <=3
number of promoted weeks for object 3 >= 3

CG = Cannibalization Group

FIG. 11

| Category | SKU | Week 1 | Week 2 | Week 3 | Week 4 | Week 5 |
|---|---|---|---|---|---|---|
| CG 1 | SKU 1 | 7.2 | 6.5 | 7.8 | 8.1 | 7.6 |
| CG 1 | SKU 2 | 7.5 | 8.1 | 7.6 | 8.4 | 9.2 |
| CG 1 | SKU 3 | 10.5 | 12.3 | 12.9 | 13.6 | 13.1 |
| CG 1 | SKU 4 | 11.8 | 9.5 | 7.5 | 8.1 | 12.4 |
| CG 1 | SKU 5 | 12 | 10.1 | 9.5 | 7.5 | 8.1 |

Weeks

1240

CG = Cannibalization Group

Prices of SKUs in Week 1

| Category | Scenario | SKU 1 | SKU 2 | SKU 3 | SKU 4 | SKU 5 |
|---|---|---|---|---|---|---|
| CG 1 | Scenario 1 | 6 | 8 | 10 | 12 | 14 |
| CG 1 | Scenario 2 | 8 | 10 | 12 | 14 | 6 |
| CG 1 | Scenario 3 | 10 | 12 | 14 | 6 | 8 |
| CG 1 | Scenario 4 | 12 | 14 | 6 | 8 | 10 |
| CG 1 | Scenario 5 | 14 | 6 | 8 | 10 | 12 |

And so on...

CG = Cannibalization Group

*FIG. 13C*

Maximize Profit

$$\text{Max } F(\ ) = \text{Max} \sum_i \sum_t \left[ \{ [D_{it} \times P_{it}] - (C_{it}) \} \right]$$

where $D_{it}$ is forecasted demand/ function of various components, $C_{it}$ is the Cost; $P_{it}$ is the Selling Price Demand for Product i in time period t:

$$D_{it} = e^{S_{it}} * e^{M_{it}} * e^{H_{it}} * \prod e^{\mu_i * PA_i} * P_{it}^{\gamma_i} * e^{\alpha_i * CC_{it}} * e^{\beta_i * Cann.Styles_{it}}$$

$P_{it} \in \{a, b, c, d, e\}$
$C_{it} \in \{l, m, n, o, p\}$
$Cann. Styles_{it} \in \{l, m, n, o, p\}$

*FIG. 14*

AUTOMATED PLANNING BASED ON CONVERTING DISCRETE FRAMEWORKS TO CONTINUOUS FRAMEWORKS

TECHNICAL FIELD

The present disclosure generally relates to automated conversions of computational frameworks to different types of computational frameworks for automated planning. More specifically, the present disclosure generally relates to converting discrete computational frameworks to continuous computational frameworks for automated planning. Even more specifically, the present disclosure generally relates to converting discrete computational frameworks to binary computational frameworks, and further to continuous computational frameworks for automated planning. Further, the present disclosure generally relates to a system and method for converting discrete computational frameworks to continuous computational frameworks for automated planning.

BACKGROUND

Automated planning is widely utilized in many different scenarios. For example, automated planning may be used in determining an optimal plan and design of a transmission network. Various computational frameworks may be used, which may provide varying levels of accuracy, and which may generate results using varying levels of computational resources, which is a common technical problem associated with computing. For example, a computational framework which utilizes integers (i.e., instead of real numbers) may generate results using a significant amount of rounding. A computational framework with integral solution space may use pre-defined approximation techniques to converge to an acceptable solution. As another example, a computational framework that supports a particular internal representation (with corresponding arithmetic routines) for real numbers may provide different results from a different computational framework that supports a different internal representation (with different corresponding arithmetic routines). This differs from human calculation, as a human is not concerned with the same constraints as for computer calculations (e.g., predetermined finite number of bits for storing values, internal routines for performing arithmetic on internal numeric representations, significant loss of accuracy with bit loss (e.g., bit cutoffs due to the internal numeric representations and corresponding internal routines) in iterative computation, etc.). As an example, a result of 3.4 may be rounded to a value of only 3. As computations progress (e.g., addition, multiplication, division of multiple values, or combinations thereof), such loss of accuracy may be significant, leading to results that may be unacceptably inaccurate. For example, if computation of a trajectory of a missile requires many calculations, and a particular sequence of computer operations results in multiple losses of accuracy, the missile may actually be ultimately controlled to hit "friendly" environments, which would likely be an unacceptable result of the computer computations. As another example, if a bank computes compound interest on loans using techniques that round iteratively, the loan customers may be charged unacceptably high interest amounts (while the bank may profit substantially more than agreed, over large numbers of loan customers), which may lead to adverse consequences for the bank.

Significant research has been performed since the advent of computing devices, to develop both hardware and software that may provide more accurate results, and it is common for different hardware and/or software to generate different results in solving common problems that may involve iterative manipulations of numeric values, with their respective internal representations, which may vary from one platform to another (including both hardware and software platforms).

For example, various automated planning systems may produce inaccurate, or only approximated results, which may adversely impact decision-making based on the results.

Further, there is a lack of techniques for determining discrete solutions to a model/framework with cannibalization existing between different objects in a portfolio, although there exist techniques that may provide solutions in a continuous space or may provide an approximate discrete solution—which may not always execute successfully.

An example relaxed solution followed by discretization generates a discrete solution to a non-linear optimization problem by solving it as a continuous problem, and then discretizing the solution by rounding it off to the nearest discrete solution in the solution dataset. However, it may be difficult to retain feasibility after rounding off. For example, a rule may be violated. Further, the technique may end with local optima in many cases.

An example simulation based technique may create all possible scenarios using discrete variable values and evaluating an objective function, filtering out infeasible scenarios in accordance with constraints, and selecting the optimal scenario from the remaining cases. However, scenario counts may increase exponentially over time, and thus generating all such scenarios may quickly become computationally infeasible.

There is a need in the art for a system and method that addresses the shortcomings discussed above.

SUMMARY

A system and method for determining a result that includes a solution in a discrete space for a non-linear optimization model is disclosed. The system and method solves the problems discussed above by automatically transforming a discrete optimization framework to a binary optimization framework, and then to a continuous framework with additional constraints, to achieve higher accuracy, in less time than conventional systems.

Further, such optimization of computer operations is resource effective, conserving processor time, memory usage, and overall improving processing efficiency. Additionally, such optimization may avoid becoming mired in local maxima, thereby improving performance to provide improved results.

Additionally, the system and method may execute successfully, and efficiently, to determine discrete solutions to a model/framework with cannibalization existing between different objects in a portfolio.

In one aspect, the disclosure provides a method for determining a result that includes a solution for a discrete non-linear optimization model for an optimization problem by: determining a non-linear relationship between a key performance indicator (KPI) to be optimized and at least one decision variable using econometric modeling, determining a discrete optimization framework for the optimization problem using a plurality of discrete values of decision variables of the optimization problem, determining a binary optimization framework from the determined discrete optimization framework based on automatically revising an optimization equation of the discrete optimization framework, automatically determining a continuous framework from the determined binary optimization framework based on imposing additional constraints and based on modifying the optimization problem, and generating the result. An action may be controlled based on the result.

In another aspect, the disclosure provides a non-transitory computer-readable medium storing instructions that are executable by one or more device processors to determine a result that includes a solution for a discrete non-linear optimization model for an optimization problem by: determining a non-linear relationship between a key performance indicator (KPI) to be optimized and at least one decision variable using econometric modeling, determining a discrete optimization framework for the optimization problem using a plurality of discrete values of decision variables of the optimization problem, determining a binary optimization framework from the determined discrete optimization framework based on automatically revising an optimization equation of the discrete optimization framework, automatically determining a continuous framework from the determined binary optimization framework based on imposing additional constraints and based on modifying the optimization problem, and generating the result. An action may be controlled based on the result.

In another aspect, the disclosure provides a system that includes a device processor and a non-transitory computer readable medium storing instructions that are executable by the device processor to determine a result that includes a solution for a discrete non-linear optimization model for an optimization problem by: determining a non-linear relationship between a key performance indicator (KPI) to be optimized and at least one decision variable using econometric modeling, determining a discrete optimization framework for the optimization problem using a plurality of discrete values of decision variables of the optimization problem, determining a binary optimization framework from the determined discrete optimization framework based on automatically revising an optimization equation of the discrete optimization framework, automatically determining a continuous framework from the determined binary optimization framework based on imposing additional constraints and based on modifying the optimization problem, and generating the result. An action may be controlled based on the result.

Other systems, methods, features, and advantages of the disclosure will be, or will become, apparent to one of ordinary skill in the art upon examination of the following figures and detailed description. It is intended that all such additional systems, methods, features, and advantages be included within this description and this summary, be within the scope of the disclosure, and be protected by the following claims.

While various embodiments are described, the description is intended to be exemplary, rather than limiting, and it will be apparent to those of ordinary skill in the art that many more embodiments and implementations are possible that are within the scope of the embodiments. Although many possible combinations of features are shown in the accompanying figures and discussed in this detailed description, many other combinations of the disclosed features are possible. Any feature or element of any embodiment may be used in combination with or substituted for any other feature or element in any other embodiment unless specifically restricted.

This disclosure includes and contemplates combinations with features and elements known to the average artisan in the art. The embodiments, features, and elements that have been disclosed may also be combined with any conventional features or elements to form a distinct invention as defined by the claims. Any feature or element of any embodiment may also be combined with features or elements from other inventions to form another distinct invention as defined by the claims. Therefore, it will be understood that any of the features shown and/or discussed in the present disclosure may be implemented singularly or in any suitable combination. Accordingly, the embodiments are not to be restricted except in light of the attached claims and their equivalents. Also, various modifications and changes may be made within the scope of the attached claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views.

FIGS. 3A-3B illustrate a determination of a discrete optimization framework and conversion to a binary optimization framework according to an embodiment;

FIG. 4 illustrates a conversion of the binary optimization problem into a continuous variable form according to an embodiment;

FIG. 5 illustrates an example conversion of a discrete optimization problem to a binary optimization problem, according to an embodiment;

FIG. 8 illustrates an example solution space that is continuous, within bounds;

FIG. 9 illustrates an example solution space that is discrete, with integer solution, within bounds;

FIG. 10 illustrates an example solution space that is discrete, with a custom definition;

FIG. 11 illustrates an example problem case;

FIGS. 12A-12C illustrate a relaxed solution followed by discretization;

FIGS. 13A-13C illustrate a simulation based technique; and

FIG. 14 illustrates an example mathematical formulation of an objective for maximizing profit.

DESCRIPTION OF EMBODIMENTS

Figure 1:
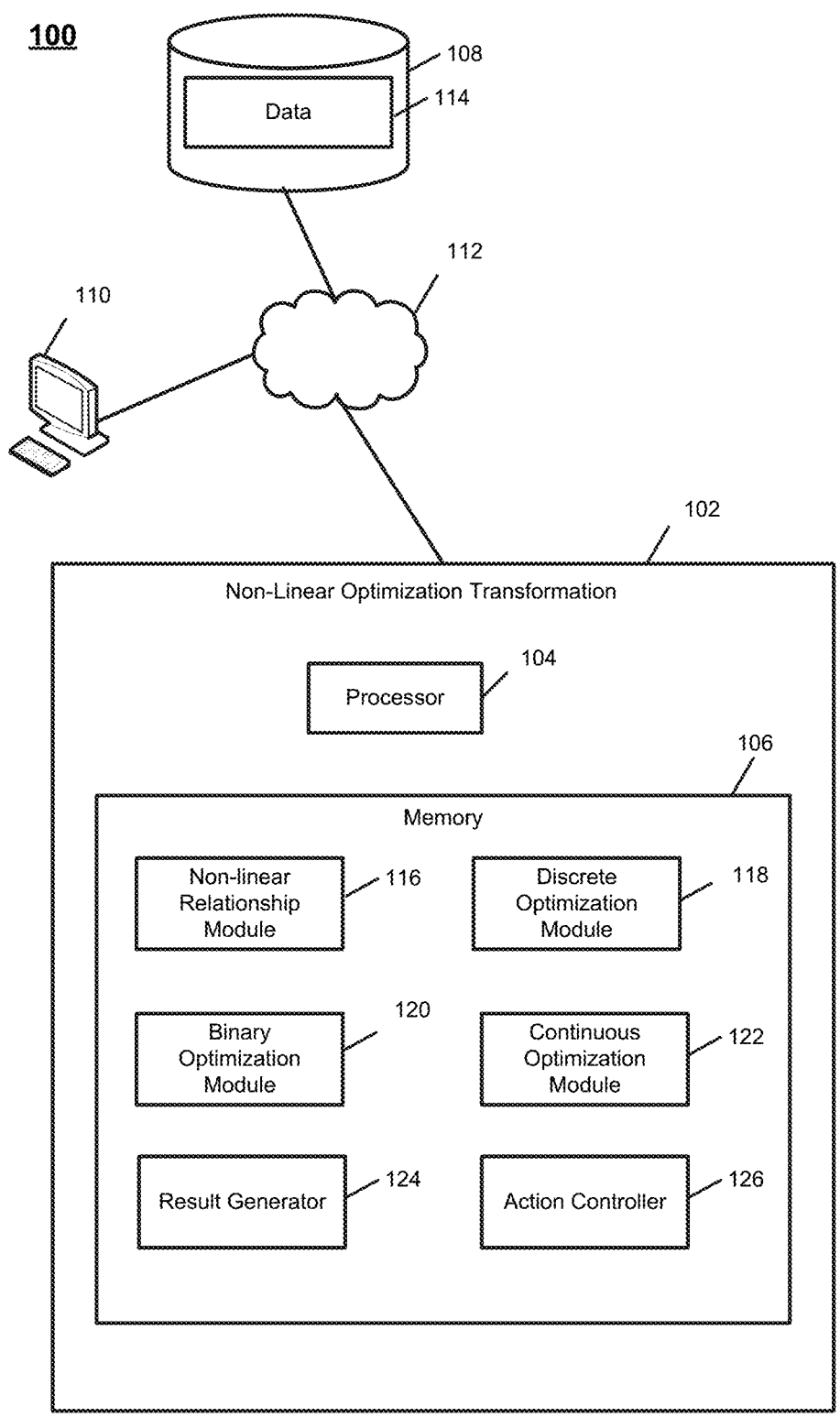
FIG. 1 is a schematic diagram of an embodiment of a system for non-linear optimization transformation.

A system and method for determining a result that includes a solution in a discrete space for a non-linear optimization model is disclosed. FIG. 1 shows an embodiment of a non-linear optimization transformation system 102. As shown in the embodiment of FIG. 1, the system 102 includes a processor 104 and a memory 106 storing components of the system 102. Processor 104 may include a single device processor located on a single device, or it may include multiple device processors located on one or more physical devices. Memory 106 may include any type of storage, which may be physically located on one physical device, or on multiple physical devices. The system 102 may communicate with a user device 110, for example, to receive user input. For example, the system 102 may communicate with user device 110 via a network 112. In some embodiments, network 112 may be a wide area network ("WAN"), e.g., the Internet. In other embodiments, network 112 may be a local area network ("LAN"). For example, in a more remote location far from a metropolitan area, the Internet may not be available. In yet other embodiments, network 112 may be a combination of a WAN and a LAN.

As shown in FIG. 1, the system 102 may communicate with a repository 108 storing data 114, for example, to store and retrieve information for processing data. For example, the data may include input data to processing modules. For example, the data may include results of the processing.

The system may include several modules. For example, FIG. 1 shows system 102 including non-linear relationship module 116, a discrete optimization module 118, a binary optimization module 120, a continuous optimization module 122, a result generator 124, and an action controller 126. Non-linear relationship module 116 may determine non-linearity in the objective function or a non-linear relationship between a key performance indicator (KPI) to be optimized and a decision variable or non-linearity in the constraints of the discrete non-linear optimization model. In some embodiments, the non-linear relationship between the key performance indicator (KPI) to be optimized and the decision variable may be utilized using econometric modeling. In the context of the present disclosure, econometric modeling refers to a technique for estimating the relationship between the KPI to be optimized and the influencing factors (e.g., historical data, business factors, macro-economic factors, customer lifestyle/preferences and demographics and the decision variables).

Discrete optimization module 118 may determine a discrete optimization framework for the optimization problem using a plurality of discrete values of decision variables of the optimization problem.

Binary optimization module 120 may determine a binary optimization framework from the determined discrete optimization framework based on automatically revising an optimization equation of the discrete optimization framework.

Continuous optimization module 122 may automatically determine a continuous framework from the determined binary optimization framework based on a constraint and based on modifying the optimization problem. In some embodiments, determining the continuous framework from the determined binary optimization framework includes formulating additional constraints and incorporating those into the optimization framework either in a form of continuous variable form or as a penalty function.

Result generator 124 may generate the result. In some embodiments, generating the result includes running optimization to determine the result in a continuous space Action controller 126 may control an action based on the result. In some embodiments, controlling the action based on the result includes controlling an optimal marketing plan.

For example, subject objects may include stock keeping units (SKUs), and controlling the action based on the result controlling the action based on a forecast associated with one of the SKUs.

In some embodiments, determining the result that includes a solution for a discrete non-linear optimization model includes determining a discrete solution to a non-linear optimization problem that includes cannibalization between subject objects. In this context, cannibalization refers to a reduction in sales volume, sales revenue, or market share of one product as a result of the introduction of a new product by a same producer or offering a discount on another product in the portfolio.

Figure 2:
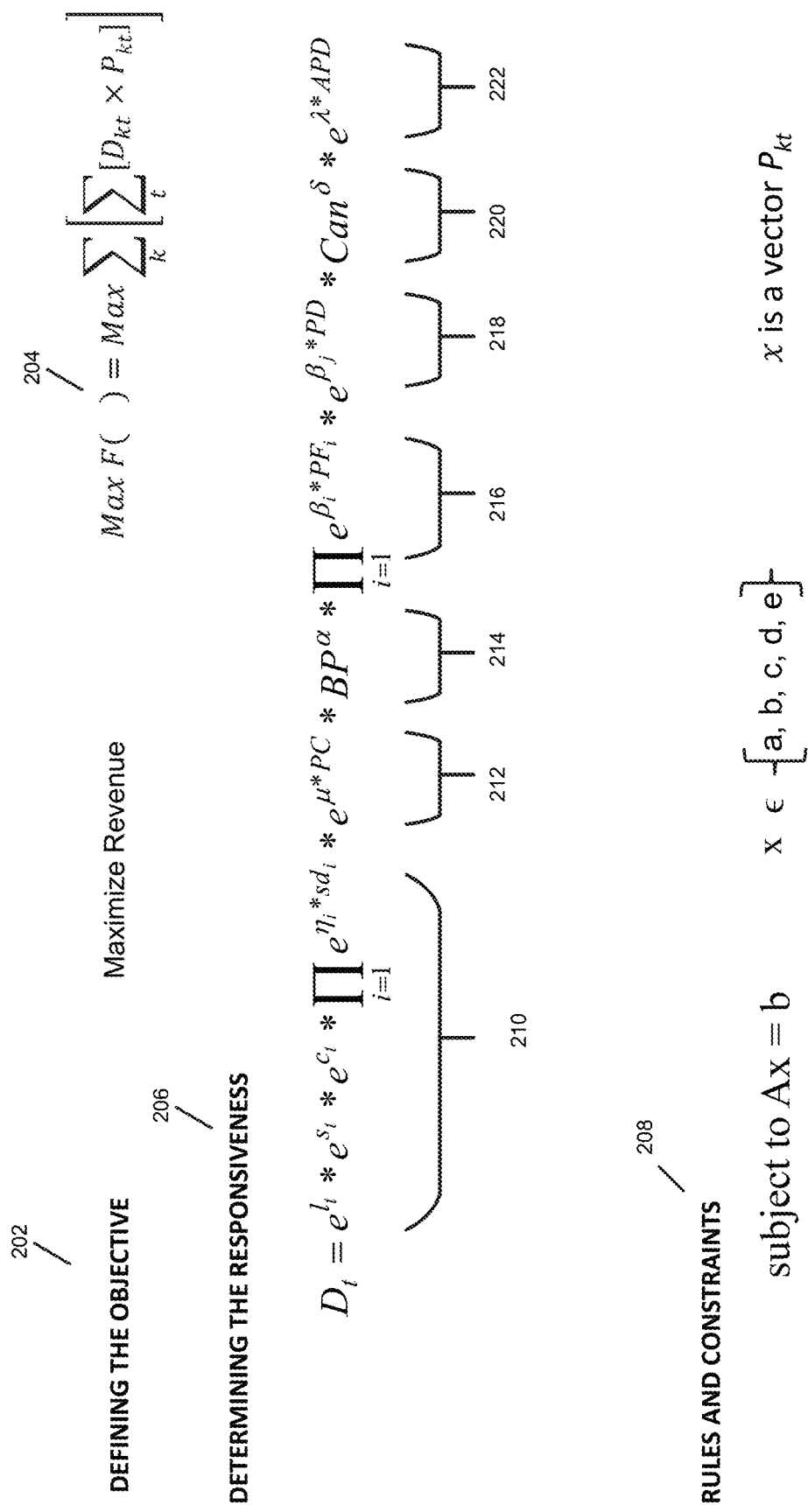
FIG. 2 is a schematic diagram of a problem definition according to an embodiment.

FIG. 2 is a schematic diagram of a problem definition according to an embodiment. As shown in FIG. 2, an objective may be defined 202. For example, the objective may be defined as maximizing revenue, indicated as equation 204, mathematically formulated as maximizing a function. While the objective here is indicated as a mathematical formula, one skilled in the art of computing will appreciate that such notation may be used to represent complex computerized operations that may include extensive iterative activity on computer-internal numeric representations of variable values. Other examples of objectives may include maximizing volume, revenue, margin, etc.

As shown in FIG. 2, the responsiveness may be determined 206, subject to rules and constraints 208. With regard the example shown in FIG. 2, an econometric modeling technique may be determined to estimate a key performance indicator (KPI) to be optimized and its relationship with a variable to be determined (e.g., a price).

For this example, relevant rules may be determined that may guide the operational feasibility of an implementation of recommendations.

With regard to the example of FIG. 2, the responsiveness is formulated as a function of seasonal components 210, category specific events 212, a retail price 214, promotional uplift factors 216, promotional discount 218, cannibalization 220, and post promotion impacts 222. As shown, the formulated responsiveness is non-linear, and the permissible solution is discrete in nature, via the constraints 208. Example techniques discussed herein may provide a computerized solution to this non-linear optimization model in a discrete space (DNLP).

Typical techniques may not obtain an optimal solution to this within a reasonable amount of computational effort and time, and further may not be able to determine a feasible solution to such formulated problems.

Example techniques discussed herein may utilize a multi-step approach to generate the discrete solution to the non-linear optimization problem. As a first step, the non-linear relationship may be determined. For example, responsiveness/elasticity and cross price elasticity may be determined using econometric modeling (i.e., determining the responsiveness of the consumer to the price changes of the product and to the price change of other products in the portfolio or the cannibalizing group). A discrete optimization framework for the optimization problem may then be set up using the discrete values of the decision variables. A binary optimization framework may be formulated and converted from the discrete optimization framework by revising the optimization equation, as discussed further herein. The binary optimization framework may be converted into a continuous optimization framework by modifying the optimization problem, using additional constraints. A discrete solution may then be determined for the non-linear optimization problem.

One skilled in the art will appreciate that complex computer operations may be described by way of mathematical interpretations that conveniently indicate the operations in a condensed format. Thus, mathematical equations may be utilized herein to represent such complex operations, in lieu of providing actual code, which may be more difficult in readability. It may be noted that many high-level computer languages may accommodate input equations, which are then translated into machine code for execution of the underlying complex computer operations, and that arrangements of such operations, on internal computer representations of values, may provide different results, in different arrangements. Thus, efficiency and accuracy may be impacted by different arrangements of computer operations.

FIGS. 3A-3B illustrate a determination of a discrete optimization framework according to an embodiment. As shown in FIG. 3A, the discrete optimization framework may be determined 302, indicated in mathematical equation form as computer operations for determining Demand 304 and Revenue 306. As shown in FIG. 3A, Demand of a product 304 indicates a non-linear relationship with a discount offered on that product and a discount offered by cannibalizing products 308. As shown in FIG. 3B, the example optimization problem may be determined 310, utilizing discrete price points 312 as solution to the decision variables. The discrete optimization framework is then converted to a binary optimization framework and hence, the revised decision variables 314 (binary variables) are created corresponding to each discrete price point.

FIG. 4 illustrates an example conversion of the binary optimization problem into a continuous variable form according to an embodiment. As shown in FIG. 4, the binary optimization problem may be converted to a continuous problem 402. As shown, such a conversion may be performed by formulating the constraint into a continuous variable form 404, or by adding the constraint as a penalty function 404. Both of these alternatives may convert the binary optimization to a continuous space.

FIG. 5 illustrates an example conversion of a discrete optimization problem to a binary optimization problem, according to an embodiment. For products 502, in weeks 504, values are shown for allowed price points 506, with econometric model output 508. An optimization problem formulation 510 for Max Total Revenue is shown, with values 512 indicated for products, by week, with indicated constraints 514.

Figure 6:
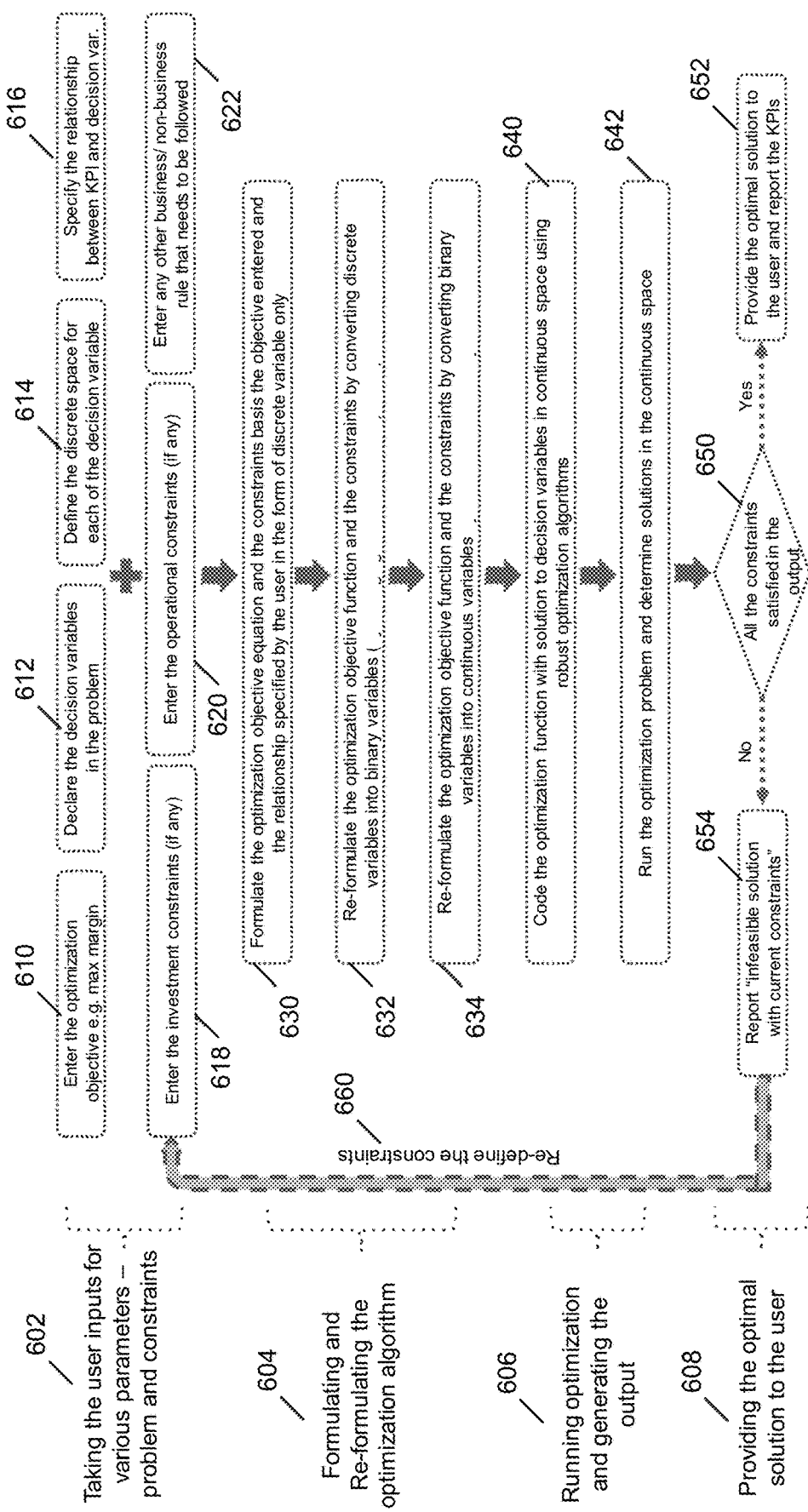
FIG. 6 illustrates a logical structure of an example system for determining optimal solutions for discrete non-linear optimization problems according to an embodiment.

FIG. 6 illustrates a logical structure of an example system for determining optimal solutions for discrete non-linear optimization problems according to an embodiment. The system obtains user inputs for various parameters for a problem and constraints 602. The optimization algorithm is then formulated (from a discrete solution space to a binary solution space) and reformulated (from a binary solution space to a continuous solution space) 604. The optimization is then executed, and output is generated 606. An optimal solution may then be provided to the user 608.

In more detail, step 602 includes steps 610-622, which include entering the optimization objective (e.g., max margin) 610, declaring the decision variables in the problem 612, defining the discrete space for each of the decision variables 614, and specifying the relationship between KPI and the decision variables 616. Step 602 further includes entering investments constraints, if any 618, entering operational constraints, if any 620, and specifying any other rule 622.

Step 604 includes formulating the optimization objective function and the constraints and the relationship specified by the user in the form of discrete variables 630, re-formulating the optimization objective function and the constraints by converting discrete variables into binary variables 632, and re-formulating the optimization objective function and the constraints by converting binary variables into continuous variables 634.

Step 606 includes coding the optimization function with solution to decision variables in a continuous space using robust optimization algorithms 640 and running the optimization problem and determining solutions in the continuous space 642.

Step 608 includes determining whether all constraints are satisfied in the output 650, and providing the optimal solution to the user and reporting the KPIs if so 652, and reporting "infeasible solution with current constraints" if not 654, followed by re-defining the constraints 660 and returning to step 618, 620, and 622.

Figure 7:
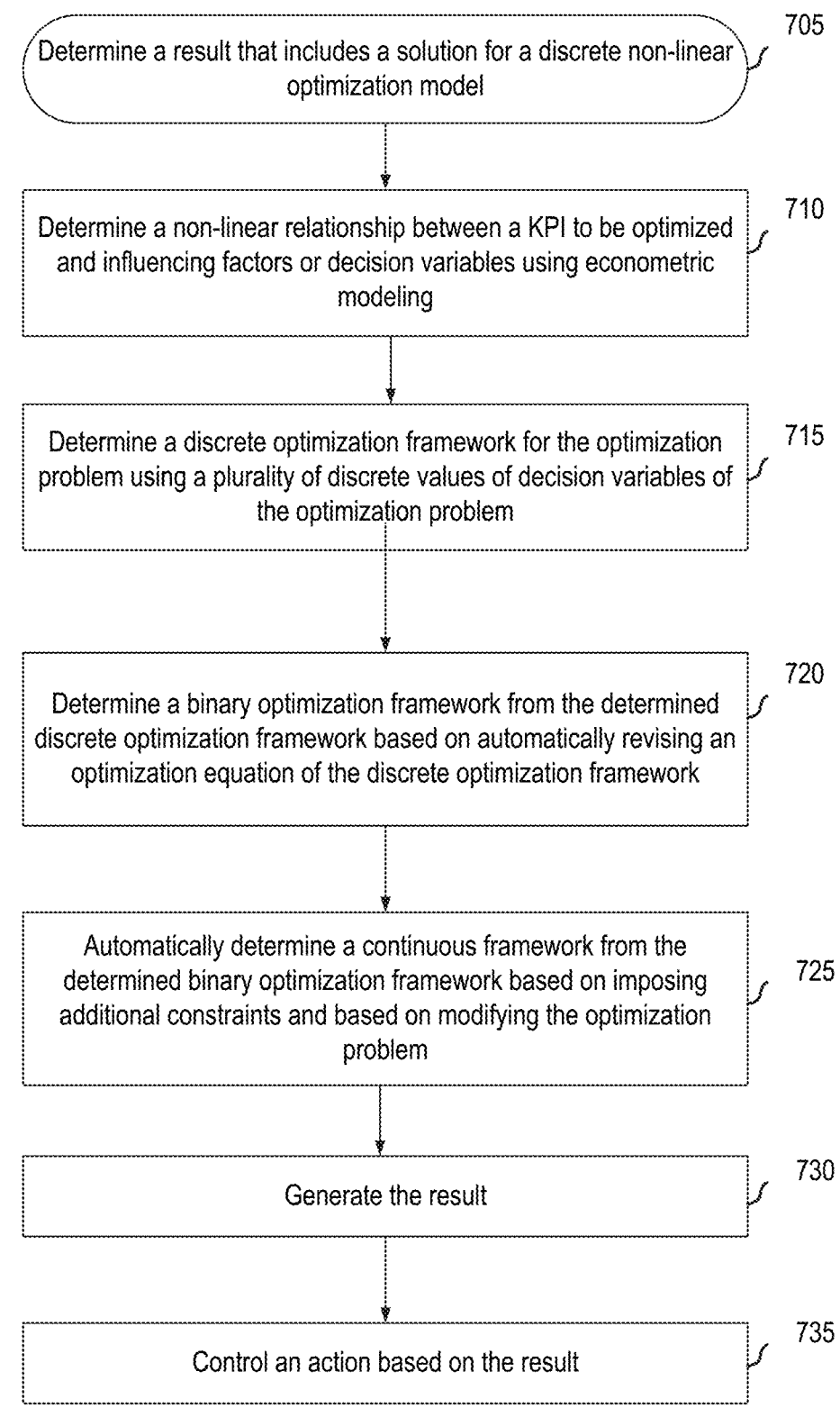
FIG. 7 is a flowchart of a method for non-linear optimization transformation according to an embodiment.

FIG. 7 is a flowchart of an example embodiment of a method of determining solutions to discrete non-linear optimization models. As shown in FIG. 7, in step 705, a result that includes a solution for a discrete non-linear optimization model for an optimization problem may be determined. In step 710, a non-linear relationship may be determined between a key performance indicator (KPI) to be optimized and at least one decision variable using econometric modeling. In step 715, a discrete optimization framework for the optimization problem may be determined using a plurality of discrete values of decision variables of the optimization problem. In step 720, a binary optimization framework may be determined from the determined discrete optimization framework based on automatically revising an optimization equation of the discrete optimization framework. In step 725, a continuous framework may be determined from the determined binary optimization framework based on imposing additional constraints and based on modifying the optimization problem.

In step 730, the result may be generated. In step 735, an action may be controlled based on the result.

A more detailed discussion of existing solutions for optimization problems follows. FIG. 8 illustrates an example solution space that is continuous, within bounds 802. As shown in FIG. 8, the solution space has 3 dimensions: P1, P2, and F, with boundary 804. Here, P1 and P2 are two decision variables and F is the objective function. The solution space for P1 and P2 is continuous. As an example, gradient based techniques may use derivative information to locate the optimum point. The first derivatives may provide a slope of the function being differentiated, and at optima it becomes zero. The gradient of the function may instruct the direction to move locally.

An example for a gradient based technique may be indicated as:

$$x_{i+1} = x_i - f'(x_i)/f''(x_i)$$

As another example, a non-linear optimizer (NLOPTR) may be used to optimize differentiable or non-differentiable objective function (F) in the continuous solution space. For example, NLOPTR may be obtained as a free open source library.

There are currently some derivative based and derivate free solving techniques that are available (e.g., SLSQP, MMA and COBYLA, DIRECT, ISRES respectively).

However, the example techniques discussed with regard to FIG. 8 may not be used if the solution space is discrete in nature.

FIG. 9 illustrates an example solution space that is discrete, with an integer solution, within bounds 902. As an example, mixed integer nonlinear programming (MINLP) optimization techniques such as iterative branch and bound, and outer approximation may be used to solve the problem for integer solutions.

Branch and bound techniques may utilize a strategy of "divide and conquer," for example, by partitioning the feasible region into more manageable sub-divisions and then, if deeded, to further partition the sub-divisions. Such techniques may utilize suitable upper and lower bounds and constraints to eliminate in-feasible regions.

As an example for a convex mixed integer programming, KNITRO ("Nonlinear Interior point Trust Region Optimization"—Artelys Knitro Optimization) may be used. As a non-Convex example, BARON (Branch and Reduce Optimization Navigator) may be used.

As another example, outer approximation techniques based on solving alternating finite sequences of non-linear programming subproblems (relaxing integer variables) and then adding linearization (i.e., an iterative process) may be used. For example, AOA (AIMMS Outer Approximation) or DICOPT may be used, for mixed-integer nonlinearly-constrained optimization problems.

However, techniques discussed with regard to FIG. 9 are used mostly for integers, and their performance on large problems may be adversely unacceptable. For example, branch and bound, iterative in nature, may pose a substantially heavy computational burden due to a need to solve a correspondingly large number of non-linear relaxation problems.

FIG. 10 illustrates an example solution space that is discrete, with a custom definition 1002. As an example, evolutionary techniques may be used for solution spaces that are discrete, with custom definitions. Evolutionary techniques include population based search procedures that incorporate random variation and selection. These start from a population of possible solutions and move towards optimal solutions by incorporating generation and selection.

For example, genetic algorithms may improve fitness through evolution.

As another example, estimation of distribution techniques may discover and exploit the interaction between variables in the solution.

As yet another example, particle swarm optimization/ant colony optimization are based on evolving social behavior and their movement towards a destination. Logic for these example techniques may be created in R/Python (by setting the parameters and conditions for initial selection, crossover, mutation).

However, techniques discussed with regard to FIG. 10 are highly dependent on the parameters selected. If the selection pressure is high, the convergence of the algorithm is fast; however, an inferior result may follow. If the selection pressure is low, a user may be likely to obtain a superior result, although convergence may be unacceptable.

Furthermore, one algorithm may not work and provide the best solution all the time—which may require a substantial amount of experimentation.

Hence, it is possible that there is no particular algorithm that optimizes an objective function (F) for a user defined (i.e., custom defined) discrete solution space.

FIG. 11 illustrates an example problem case. A table 1102 illustrates a problem case with 5 SKUs in a portfolio/cannibalizing group. The price for every SKU—in every week—can be one of the 5 price points {P1, P2, P3, P4, P5}. For the example of FIG. 11, an objective is to determine the optimal price point for these 5 SKUs for 5 weeks so as to maximize the total revenue of the portfolio for these 5 weeks, with constraints 1104. If there is no existing technique for providing this solution in the specified discrete space, alternate techniques for deriving that may be assessed. Example alternate solutions may include a relaxed solution followed by discretization, as illustrated in FIGS. 12A-12C, and simulation based techniques, as illustrated in FIGS. 13A-13C.

Figures 12A, 12B:
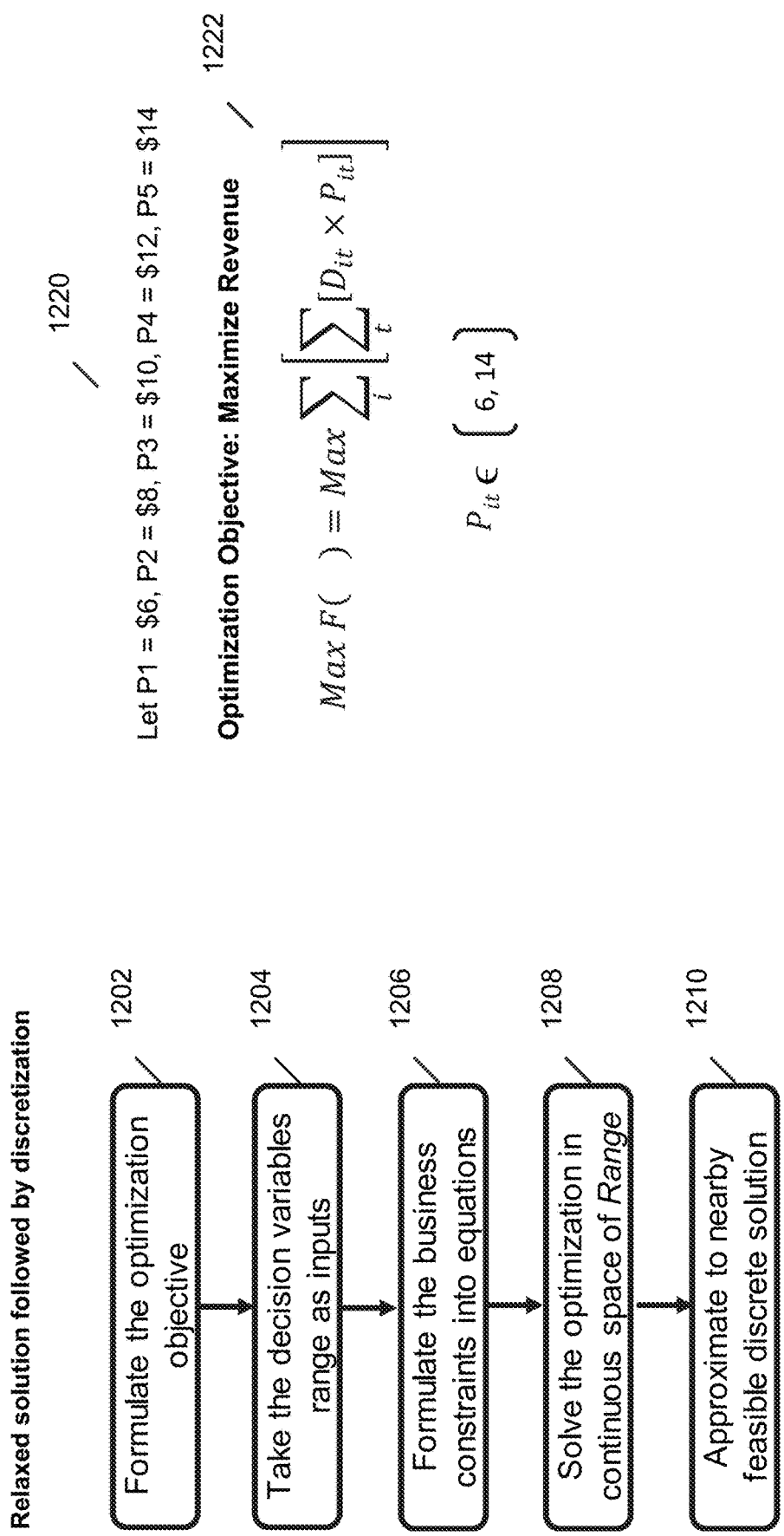
Figures 13A, 13B:
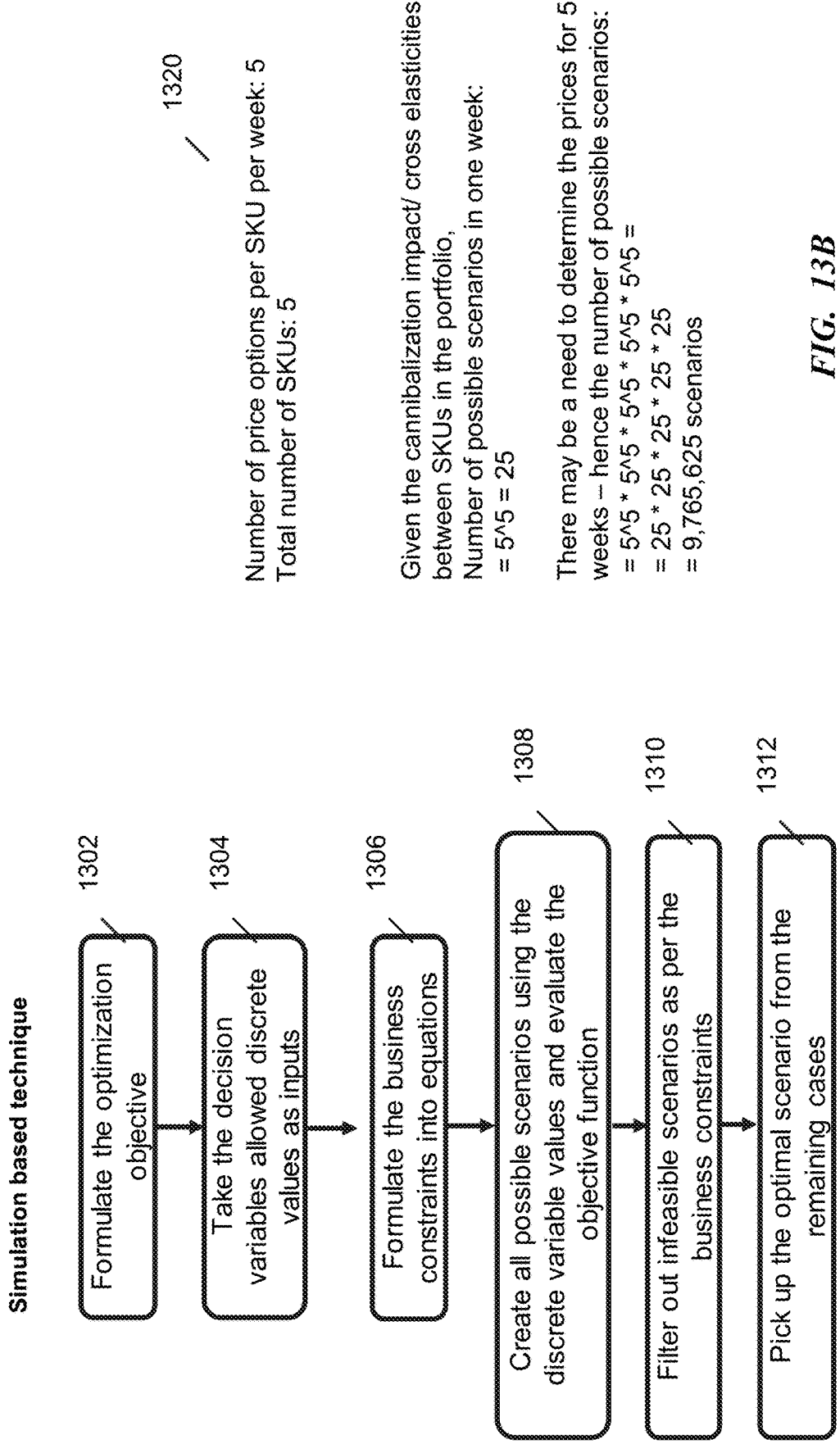

FIGS. 12A-12C illustrate a relaxed solution followed by discretization, as an alternate technique for generating a discrete solution to a non-linear optimization problem, by solving it as a continuous problem, and then discretize the solution by rounding it off to the nearest discrete solution in the solution dataset.

As shown in FIG. 12A, the example relaxed solution followed by discretization may be described by formulating the optimization objective 1202, taking the decision variables range as inputs 1204, formulating the business constraints into equations 1206, solving the optimization in continuous space of Range 1208, and approximating to a nearby feasible discrete solution 1210. FIG. 12B illustrates example price points 1220, and a formulated optimization objective 1220, indicated as maximize revenue, for this example.

FIG. 12C illustrates an optimal solution 1240 for this example. Once the solutions are obtained by relaxing the discrete condition, they are discretized by rounding off to the nearest discrete solution in the solution dataset. However, it may be difficult to retain feasibility after rounding-off. For example, in this case, a business rule of maximum number of promoted items in week 3 to be equal to 3, may be violated. Further, the technique may end with local optima in many cases.

FIGS. 13A-13C illustrate a simulation based technique, as yet another alternate technique. As shown in FIG. 13A, the example simulation based technique may be described by formulating the optimization objective 1302, taking the decision variables allowed discrete values as inputs 1304, formulating the business constraints into equations 1306, creating all possible scenarios using the discrete variable values and evaluating the objective function 1308, filtering out infeasible scenarios in accordance with constraints 1310, and picking up the optimal scenario from the remaining cases 1312.

As indicated in FIG. 13B, for this example, there are 5 distinct price points allowed for every product in the portfolio, in every week (1320). If a user wants to create scenarios based on all the pricing options and then assess the KPI in each of the scenarios to pick up the optimal scenario, the scenario count shown in FIG. 13B may follow. FIG. 13C illustrates an example table 1340 of scenarios for one week (Week 1). With the increases in the number of SKUs in the portfolio/cannibalization group and the increases in the number of possible price/promotion scenarios per SKU, this would increase exponentially, and hence generating these scenarios externally may be computationally infeasible.

Thus, existing techniques and alternate solutions may not be able to provide the solution every time, and therefore the example techniques discussed herein may be utilized instead.

Example techniques discussed herein may be used in many different use cases. For example, in power system planning, an optimal plan and design of a transmission network may be desired. This may involve a question of what should be the optimal transmission system to meet a forecasted demand while minimizing the investment/cost. An analysis may be performed to determine what transmission facilities are to be added to the network (e.g., what should be the ideal voltage), where they should be installed (e.g., where should additional facilities be installed and where should facilities be decommissioned), and when should a facility be built (e.g., determining the optimal plan for a whole planning period) to meet the potential demand in the future considering various constraints.

For this example, an objective function may be formulated as minimizing investment in network construction and operational costs, which may be indicated as:

Min $F(x)=f$(Operating Cost, Investment Cost, Load Shedding Cost)$=f$(duration of demand period, output of generator, length of line, per unit operating cost of generator, capacity of line, inv cost . . . )

For this example, marginal cost may follow a non-linear relationship. Decision variables may include selection of the transmission lines and voltage control, which are discrete in nature.

For this example, constraints may include power flow and balancing of generation and demand at each node, bounds on minimum and maximum generation by area and technology, and transfer capacity in existing and candidate transmission lines. These constraints illustrate non-linearities of power flow.

It may be desired to determine new investments that should be made in the transmission network in the medium to long term horizons.

It may further be desirable to manage power flow during peak hours of usage. An example challenge of this problem is that increasing demand for electricity places significant pressure on the electrical utility grid during peak hours.

Example techniques discussed herein may be utilized, as a non-linear relationship may be realized, since electricity usage patterns may be expressed as a function of factors such as income, household behavior, lifestyles, weather, etc. Providing financial benefits or charging optimal electricity tariffs may help with effective electrical demand management. A varied tariff may encourage and motivate consumers to shift consumption from peak to non-peak hours. For this example, decision variables may thus be discrete in nature.

Example techniques discussed herein may also be used for trade promotion analytics. For example, an optimal promotional plan for a desired time period may include determining what to promote, how to promote, and when to promote. In some embodiments, a determination may be made as to how frequently products should be promoted, what should be an ideal duration of the promotion, and what should be the timing/optimal gap between promotions.

For example, a demand model $D_t$ as shown in FIG. 2 may be used in understanding the current offering. Given the cannibalization relationship/cross-effects between different products in the portfolio, there could be a substantially large number of possible pricing options, leading to different impacts on the key performance indicators (KPIs). An optimal promotion calendar with business rules specified in the form of constraints may be generated, which may save many hours of planning time.

Example techniques discussed herein may also be used for determining an optimal inventory plan to meet sales goals as planned. Improved inventory management may result in improved control and optimization of stock to enhance profit in the apparels industry. Planning for this industry may be divided into 3 major groups/stages: merchandising planning, pre-season planning, and in-season management. For example, merchandising planning may include setting up future performance goals for various metrics such as sales, inventory, other financial metrics, etc., and tracking variation to those. Pre-season planning may involve determining/forecasting the demand to support optimum buy and optimal initial allocation. In-season management may include rapidly responding to actual demand and optimizing inventory levels.

At a high level, pre-season planning includes clustering the stores and understanding the demand patterns, followed by forecasting the demand and determining the optimal buy plan by optimizing the size and pack. This example technique may be utilized in analyzing demand patterns and determining an optimal buy plan by optimizing the size and pack.

In more detail, this may involve defining store and product attributes followed by clustering; defining buying periods, studying the historical patterns and forecasting the demand; generating size profiles, translating the size level demand into optimal pack level orders, and generating the buy plans and reconciling to MFP or space; and finally, approving and creating purchase orders.

While determining the optimal pack level orders, the objective may be determined as: Maximize the sales profit/ Minimize revenue loss due to lost sales/Minimize cost of service, which may be indicated as $$F(x) = f \text{ (Products attributes, Options, Customer lifestyle, Special events,}$$
$$\text{Macroeconomic factors, Seasonality, Trend, Demographics,}$$
$$\text{Price, inventory holding cost, ordering cost, purchase cost)}$$

As can be seen, there exists non-linearity in the relationship.

A discrete nature of the decision variables may be noted in translating merchandise purchases from the style/size level into optimized pack level orders, subject to space constraints, supply constraints, and/or other rules.

FIG. 14 illustrates an example mathematical formulation of an objective for maximizing profit.

As shown in FIG. 14, an objective may be defined 1402. For example, the objective may be defined as maximizing profit, indicated as equation 1404, mathematically formulated as maximizing a function on variable x. While the objective here is indicated as a mathematical formula, one skilled in the art of computing will appreciate that such notation may be used to represent complex computerized operations that may include extensive iterative activity on computer-internal numeric representations of variable values. Other examples of objectives may include maximizing volume, revenue, margin, etc.

As shown in FIG. 14, the forecasted demand may be determined 1406, subject to rules and constraints 1408.

With regard to the example of FIG. 14, the forecasted demand is formulated using seasonal components and demographic components 1410, product attributes 1412, a retail price 1414, a count of options 1416, and a count of options in the cannibalization group 1418. As shown, the formulated forecasted demand is non-linear, and the decision variables are discrete in nature 1408. Example techniques discussed herein may provide a computerized solution to this discrete non-linear optimization model (DNLP).

Studying the recent history and adjusting the demand forecasts; adjusting the store sales and plan and reallocating the inventory to meet the sales goals as planned, may help drive demand driven inventory replenishment and increased availability during the in-season management.

Re-formulating the optimization problem using the example techniques discussed herein may help reduce processing time. For an example objective of testing the impact of increasing the number of styles with any particular attributes on the sales, it may be noted that this relationship is non-linear.

The objective may be to determine the optimal style count for any attribute group. In this case, there may be numerous scenarios possible, since there could be cannibalization impact of presence of any product attribute in the assortment on the sales for another product attributes and hence on a sales/objective function.

There could be at least two ways considered for solving this problem: simulation based techniques or the optimization based techniques as discussed herein. The optimization based techniques as discussed herein may reduce the processing time up to one-third, compared to simulation based techniques.

Implementations of the various techniques described herein may be implemented in digital electronic circuitry, or in computer hardware, firmware, software, or in combinations of them (e.g., an apparatus configured to execute instructions to perform various functionality).

Alternatively, implementations may be implemented as a computer program embodied in a machine usable or machine readable storage device (e.g., a magnetic or digital medium such as a Universal Serial Bus (USB) storage device, a tape, hard disk drive, compact disk, digital video disk (DVD), etc.), for execution by, or to control the operation of, data processing apparatus, e.g., a programmable processor, a computer, or multiple computers. Such implementations may be referred to herein as implemented via a non-transitory "computer-readable storage medium" or a "computer-readable storage device."

A computer program, such as the computer program(s) described above, can be written in any form of programming language, including compiled, interpreted, or machine languages, and can be deployed in any form, including as a stand-alone program or as a module, component, subroutine, or other unit suitable for use in a computing environment. The computer program may be tangibly embodied as executable code (e.g., executable instructions) on a machine usable or machine readable storage device (e.g., a computer-readable medium). A computer program that might implement the techniques discussed above may be deployed to be executed on one computer or on multiple computers at one site or distributed across multiple sites and interconnected by a communication network.

Method steps may be performed by one or more programmable processors executing a computer program to perform functions by operating on input data and generating output. The one or more programmable processors may execute instructions in parallel, and/or may be arranged in a distributed configuration for distributed processing. Example functionality discussed herein may also be performed by, and an apparatus may be implemented, at least in part, as one or more hardware logic components. For example, and without limitation, illustrative types of hardware logic components that may be used may include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

Processors suitable for the execution of a computer program include, by way of example, both general and special purpose microprocessors, and any one or more processors of any kind of digital computer. Generally, a processor may receive instructions and data from a read only memory or a random access memory or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto optical disks, or optical disks. Information carriers suitable for embodying computer program instructions and data include all forms of nonvolatile memory, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory may be supplemented by, or incorporated in special purpose logic circuitry.

To provide for interaction with a user, implementations may be implemented on a computer having a display device, e.g., a cathode ray tube (CRT), liquid crystal display (LCD), or plasma monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback. For example, output may be provided via any form of sensory output, including (but not limited to) visual output (e.g., visual gestures, video output), audio output (e.g., voice, device sounds), tactile output (e.g., touch, device movement), temperature, odor, etc.

Further, input from the user can be received in any form, including acoustic, speech, or tactile input. For example, input may be received from the user via any form of sensory input, including (but not limited to) visual input (e.g., gestures, video input), audio input (e.g., voice, device sounds), tactile input (e.g., touch, device movement), temperature, odor, etc.

Further, a natural user interface (NUI) may be used to interface with a user. In this context, a "NUI" may refer to any interface technology that enables a user to interact with a device in a "natural" manner, free from artificial constraints imposed by input devices such as mice, keyboards, remote controls, and the like.

Examples of NUI techniques may include those relying on speech recognition, touch and stylus recognition, gesture recognition both on a screen and adjacent to the screen, air gestures, head and eye tracking, voice and speech, vision, touch, gestures, and machine intelligence. Example NUI technologies may include, but are not limited to, touch sensitive displays, voice and speech recognition, intention and goal understanding, motion gesture detection using depth cameras (e.g., stereoscopic camera systems, infrared camera systems, RGB (red, green, blue) camera systems and combinations of these), motion gesture detection using accelerometers/gyroscopes, facial recognition, 3D displays, head, eye, and gaze tracking, immersive augmented reality and virtual reality systems, all of which may provide a more natural interface, and technologies for sensing brain activity using electric field sensing electrodes (e.g., electroencephalography (EEG) and related techniques).

Implementations may be implemented in a computing system that includes a back end component, e.g., as a data server, or that includes a middleware component, e.g., an application server, or that includes a front end component, e.g., a client computer having a graphical user interface or a Web browser through which a user can interact with an implementation, or any combination of such back end, middleware, or front end components. Components may be interconnected by any form or medium of digital data communication, e.g., a communication network. Examples of communication networks include a local area network (LAN) and a wide area network (WAN), e.g., the Internet.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

We claim:

1. A method comprising:
formulating an optimization objective of a non-linear optimization problem that includes cannibalization between subject objects;
determining a result that includes a discrete solution for a discrete non-linear optimization model that achieves the optimization objective of the non-linear optimization problem by:
determining a non-linear relationship between a key performance indicator (KPI) to be optimized and at least one decision variable using econometric modeling,
determining a discrete optimization framework for the optimization problem using a plurality of discrete values of decision variables of the optimization problem,
determining a binary optimization framework from the determined discrete optimization framework based on automatically revising an optimization equation of the discrete optimization framework,
automatically determining a continuous framework from the determined binary optimization framework based on imposing additional constraints and based on modifying the optimization problem, and
generating the result; and
controlling an action based on the result.

2. The method of claim 1, wherein the determining the continuous framework from the determined binary optimization framework includes formulating the constraints into a continuous variable form.

3. The method of claim 1, wherein the determining the continuous framework from the determined binary optimization framework includes adding at least one of the constraints as a penalty function.

4. The method of claim 1, wherein the optimization objective includes revenue maximization.

5. The method of claim 1, wherein the generating the result includes running optimization to determine the result in a continuous space.

6. The method of claim 1, wherein the controlling the action based on the result includes controlling an optimal marketing plan.

7. The method of claim 1, wherein:
subject objects include stock keeping units (SKUs); and
the controlling the action based on the result includes controlling the action based on a forecast associated with one of the SKUs.

8. A non-transitory computer-readable medium storing instructions that are executable by one or more device processors to:
formulate an optimization objective of a non-linear optimization problem that includes cannibalization between subject objects;
determine a result that includes a discrete solution for a discrete non-linear optimization model that achieves the optimization objective of the non-linear optimization problem by:
determining a non-linear relationship between a key performance indicator (KPI) to be optimized and at least one decision variable using econometric modeling,
determining a discrete optimization framework for the optimization problem using a plurality of discrete values of decision variables of the optimization problem,
determining a binary optimization framework from the determined discrete optimization framework based on automatically revising an optimization equation of the discrete optimization framework,
automatically determining a continuous framework from the determined binary optimization framework based on imposing additional constraints and based on modifying the optimization problem, and
generating the result; and
control an action based on the result.

9. The non-transitory computer-readable medium of claim 8, wherein the determining the continuous framework from the determined binary optimization framework includes formulating the constraints into a continuous variable form.

10. The non-transitory computer-readable medium of claim 8, wherein the determining the continuous framework from the determined binary optimization framework includes adding at least one of the constraints as a penalty function.

11. The non-transitory computer-readable medium of claim 8, wherein the optimization objective includes revenue maximization.

12. The non-transitory computer-readable medium of claim 8, wherein the generating the result includes running optimization to determine the result in a continuous space.

13. The non-transitory computer-readable medium of claim 8, wherein the controlling the action based on the result includes controlling an optimal marketing plan.

14. The non-transitory computer-readable medium of claim 8, wherein:
subject objects include stock keeping units (SKUs); and
the controlling the action based on the result includes controlling the action based on a forecast associated with one of the SKUs.

15. A system comprising:
a device processor; and
a non-transitory computer readable medium storing instructions that are executable by the device processor to:
formulate an optimization objective of a non-linear optimization problem that includes cannibalization between subject objects;
determine a result that includes a discrete solution for a discrete non-linear optimization model that achieves the optimization objective of the non-linear optimization problem by:
determining a non-linear relationship between a key performance indicator (KPI) to be optimized and at least one decision variable using econometric modeling,
determining a discrete optimization framework for the optimization problem using a plurality of discrete values of decision variables of the optimization problem,
determining a binary optimization framework from the determined discrete optimization framework based on automatically revising an optimization equation of the discrete optimization framework, automatically determining a continuous framework from the determined binary optimization framework based on imposing additional constraints and based on modifying the optimization problem, and generating the result; and control an action based on the result.

16. The system of claim 15, wherein the determining the continuous framework from the determined binary optimization framework includes formulating the constraints into a continuous variable form.

17. The system of claim 15, wherein the determining the continuous framework from the determined binary optimization framework includes adding at least one of the constraints as a penalty function.

18. The system of claim 15, wherein the optimization objective includes revenue maximization.

19. The system of claim 15, wherein the generating the result includes running optimization to determine the result in a continuous space.

20. The system of claim 15, wherein the controlling the action based on the result includes controlling an optimal marketing plan.

\* \* \* \* \*